US010511139B2

(12) United States Patent
Schrama

(10) Patent No.: US 10,511,139 B2
(45) Date of Patent: Dec. 17, 2019

(54) TRANSPARENT CONDUCTING FILM OR COATING ON A LENS THAT SERVES AS AN INTERLOCK ON A SEMICONDUCTOR LASER MODULE

(71) Applicant: Lumileds LLC, San Jose, CA (US)

(72) Inventor: Charles André Schrama, San Jose, CA (US)

(73) Assignee: Lumileds LLC, San Jose, CA (US)

(*) Notice: Subject to any disclaimer, the term of this patent is extended or adjusted under 35 U.S.C. 154(b) by 0 days.

(21) Appl. No.: 15/885,266

(22) Filed: Jan. 31, 2018

(65) Prior Publication Data

US 2019/0237935 A1 Aug. 1, 2019

(51) Int. Cl.
*H01S 5/00* (2006.01)
*H01S 5/028* (2006.01)
*H01S 5/187* (2006.01)
*H01S 5/14* (2006.01)
*H01S 5/183* (2006.01)
(Continued)

(52) U.S. Cl.
CPC ............ *H01S 5/028* (2013.01); *H01S 5/0228* (2013.01); *H01S 5/02288* (2013.01); *H01S 5/14* (2013.01); *H01S 5/187* (2013.01); *H01S 5/18308* (2013.01); *H01S 5/4018* (2013.01); *H01S 5/423* (2013.01); *G01J 2003/423* (2013.01);
(Continued)

(58) Field of Classification Search
CPC ........ H01S 5/4018; H01S 5/423; H01S 5/028; H01S 5/4025; H01S 5/42; H01S 5/0228; H01S 5/02288
See application file for complete search history.

(56) References Cited

U.S. PATENT DOCUMENTS 6,392,979 B1 * 5/2002 Yamamoto .............. H01S 5/125 369/116
2010/0054290 A1 * 3/2010 Hatakeyama ......... H01S 5/1835 372/36
(Continued)

FOREIGN PATENT DOCUMENTS

DE 102015101424 A1 8/2016

OTHER PUBLICATIONS

"Indium tin oxide," https://en.wikipedia.org/wiki/Indium_tin_oxide, Available at: https://web.archive.org/web/20171207014738/https://en.wikipedia.org/wiki/Indium_tin_oxide (Dec. 7, 2017).
(Continued)

*Primary Examiner* — Kinam Park
(74) *Attorney, Agent, or Firm* — Schwegman Lundberg & Woessner, P.A.

(57) ABSTRACT

Method and apparatuses are described herein for providing laser safety in semiconductor laser modules. For example, a semiconductor laser module may comprise a semiconductor laser and an optical element. The optical element that is operatively coupled with the semiconductor laser may disperse the laser light emitted from the semiconductor laser. The optical element may be coated with a transparent conductive material that serves as an interlock on the semiconductor laser. The transparent conductive material may be placed in the shape of a trace on the optical element where the trace is electrically in series with the semiconductor laser. On a condition that the trace is damaged, the laser light emitted from the semiconductor laser may be interrupted.

17 Claims, 6 Drawing Sheets

100
130
110
120
140

(51) Int. Cl.

*H01S 5/40* (2006.01)
*H01S 5/42* (2006.01)
*H01S 5/022* (2006.01)
*G01J 3/42* (2006.01)

(52) U.S. Cl.

CPC ............... *H01S 5/4025* (2013.01); *H01S 5/42* (2013.01); *H01S 2301/17* (2013.01)

(56) References Cited

U.S. PATENT DOCUMENTS

| | | | | |
|---|---|---|---|---|
| 2014/0009952 | A1* | 1/2014 | Nomura | H01S 5/00 362/509 |
| 2016/0290856 | A1 | 10/2016 | Fiederling et al. | |
| 2018/0014377 | A1 | 1/2018 | Steinkamp et al. | |

OTHER PUBLICATIONS

International Electrotechnical Commission, "Safety of laser products—Part 1: Equipment classification and requirements," IEC 60825-1:2014 (2014).

"European Application Serial No. 18165903.8, Extended European Search Report dated Oct. 15, 2018", 8 pgs.

"International Application Serial No. PCT/US2019/015766, International Search Report dated Apr. 5, 2019", 4 pgs.

"International Application Serial No. PCT/US2019/015766, Written Opinion dated Apr. 5, 2019", 6 pgs.

* cited by examiner

TRANSPARENT CONDUCTING FILM OR COATING ON A LENS THAT SERVES AS AN INTERLOCK ON A SEMICONDUCTOR LASER MODULE

FIELD OF INVENTION

The disclosed embodiments are generally related to a semiconductor laser module, and more particularly to semiconductor laser safety with transparent conducting film or coating on a lens that serves as an interlock.

BACKGROUND

Semiconductor lasers, such as vertical-cavity surface-emitting lasers (VCSELs), are widely used for face or iris recognition. Specifically, the laser radiation is dispersed by an optical element or lens into a large solid angle, which is then directed toward the iris or face. A camera module may detect the reflected radiation, and then image processing algorithms may perform the biometric identification. In order for such laser modules to be considered safe, it needs to comply with laser safety standards such as International Electrotechnical Commission (IEC) 60825. In conventional laser modules, a metal piece (or metal cap) is used to provide laser safety and meet such safety standards. For example, if the metal piece is damaged, removed or broken, the electrical connection to the laser is disrupted and the laser switches off. However, these conventional laser modules are bulky and incomplete because it requires a separate metal piece to detect damage in the laser module. Furthermore, the metal piece needs to include an aperture where laser light emits through. If damage occurs on the portion of lens that is exposed through the aperture, the conventional laser modules cannot shut down the laser light because the portion is not protected by the metal piece. Thus, it would be desirable to have methods and apparatuses that provide complete laser safety with reduced size by transparent, conductive film or coating on a lens that serves as an interlock.

SUMMARY

Method and apparatuses are described herein for providing laser safety in semiconductor laser modules. For example, a semiconductor laser module may comprise a semiconductor laser and an optical element. The semiconductor laser may emit laser light through the optical element. The optical element that is operatively coupled with the semiconductor laser may disperse or diffuse the laser light emitted from the semiconductor laser. The optical element may be coated with a transparent, conductive material that serves as an interlock on the semiconductor laser. The transparent, conductive material may comprise at least one of an indium tin oxide (ITO), aluminum-doped zinc oxide (AZO), gallium-doped zinc oxide (GZO), or indium-doped zinc oxide (IZO). In addition, the transparent, conductive material may be placed in the shape of a trace on the optical element where the trace is electrically in series with the semiconductor laser. On a condition that the trace is damaged, fractured, or broken, the laser light emitted from the semiconductor laser may be interrupted.

BRIEF DESCRIPTION OF THE DRAWINGS

A more detailed understanding may be had from the following description, given by way of example in conjunction with the accompanying drawings, wherein like reference numerals in the figures indicate like elements, and wherein.

DETAILED DESCRIPTION OF THE PREFERRED EMBODIMENTS

It is to be understood that the figures and descriptions for a method and apparatus for transparent conducting film or coating on a lens that serves as an interlock on a semiconductor laser module has been simplified to illustrate elements that are relevant for a clear understanding, while eliminating, for the purpose of clarity, many other elements found in typical device processing. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein.

Described herein is a method and apparatus for a semiconductor laser module with transparent conducting film or coating on an optical element (or lens) that serves as an interlock. For example, a semiconductor laser module may comprise a semiconductor laser and an optical element (or a lens). The optical element operatively coupled with the semiconductor laser may disperse or diffuse the laser light emitted from the semiconductor laser. The optical element may be coated with transparent, conductive film or coating that serves as an interlock on the semiconductor laser. The transparent, conductive film or coating may be in the shape of a trace where the trace is electrically in series with the semiconductor laser. If the trace is damaged, fractured, or broken by external force, the laser light emitting from the semiconductor laser may be switched off. The transparent, conductive film or coating may be made of, for example, an indium tin oxide (ITO), aluminum-doped zinc oxide (AZO), gallium-doped zinc oxide (GZO), indium-doped zinc oxide (IZO), or any combination thereof.

Figure 1A:
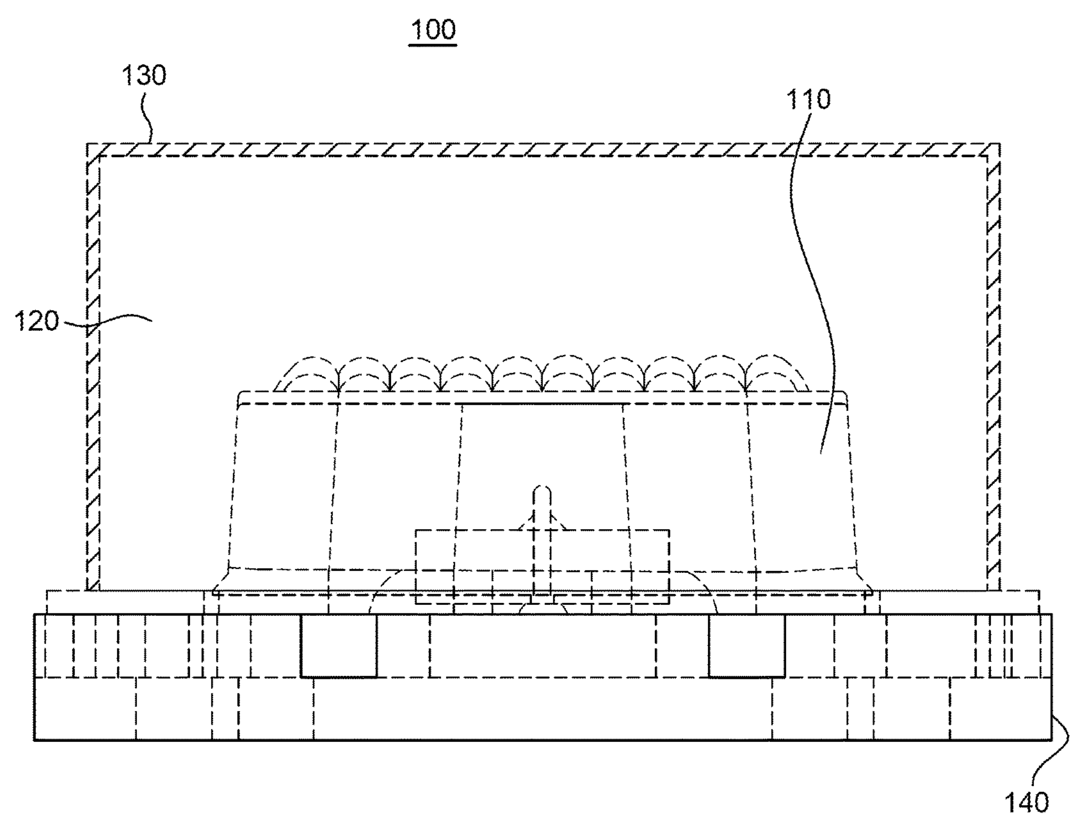
FIG. 1A is a system diagram illustrating an example semiconductor laser module that includes an optical element coated with a transparent, conductive material that serves as an interlock.

FIG. 1A illustrates an example semiconductor laser module 100 that includes an optical element 120 that are filmed or coated with a transparent, conductive layer 130. The transparent, conductive layer 130 may serve as an interlock on a semiconductor laser 110. For example, the semiconductor laser module 100 includes a semiconductor laser 110, an optical element 120, a transparent conductive layer 130, and a printed circuit board (PCB) 140.

The semiconductor laser 110 is a device that causes laser oscillation by flowing an electric current to semiconductor. Specifically, light is generated by flowing the forward current to a p-n junction. In forward bias operation, the p-type layer is connected with the positive terminal and the n-type layer is connected with the negative terminal, electrons enter from the n-type layer and holes from the p-type layer. When the two meet at the junction, an electron drops into a hole and light is emitted at the time. The types of semiconductor laser 110 include, but are not limited to, Laser diode (LD), Double heterostructure laser (DH), Separate confinement heterostructure laser (SCH), Distributed Bragg reflector laser (DBR), Distributed feedback laser (DFB), Quantum well laser, Quantum dot laser, Quantum cascade laser (QCL), External-cavity laser (ECL), Extended cavity diode laser, Volume Bragg grating laser, Vertical-cavity surface-emitting laser (VCSEL), Vertical-external-cavity surface-emitting-laser (VECSEL), Hybrid silicon laser, Interband cascade laser (ICL), and Semiconductor ring laser. As used herein, the terms semiconductor laser, laser diode (LD), injection laser diode (ILD) or diode laser and variations thereof may be used interchangeably throughout this disclosure.

In an embodiment, the semiconductor laser 110 may be infrared red lasers such as vertical-cavity surface-emitting lasers (VCSEL). VCSELs, may be used for face and iris recognition. When implementing a VCSEL into an application such as iris or facial recognition, the semiconductor laser module 100 needs to comply with laser safety regulations such as International Electrotechnical Commission (IEC) 60825. This may require a feature in the semiconductor laser module 100 that shuts down the laser when the system becomes unsafe. For example, this can happen when the optical element 120 (or lens) in a semiconductor laser module 100 is fractured, removed, or broken.

The optical element 120 (or lens) diffuses or disperses the laser radiation in a larger solid angle such that it is safe to use. Without the optical element 120 (or lens), the system would be unsafe to use. This is especially worrying when systems are used for iris recognition in a mobile application. The optical element 120 may be any type of optical lens. Examples of the optical element 120 include, but are not limited to, a convex lens, biconvex lens, equiconvex lens, concave lens, biconcave lens, plano-convex lens, plano-concave lens, convex-concave (or meniscus) lens, positive meniscus lens, negative meniscus lens, and positive (or converging) lens. Although the optical element 120 is illustrated as a rectangular prism in FIGS. 1A and 1B, the optical element 120 may not be limited to such a shape and may be in any type of two dimensional or three dimensional shapes. For example, the optical element 120 may be a circle, ellipse, oval, square, rectangle, triangle, pentagon, hexagon, octagon, triangle, cylinder, sphere, disk, cube, cone, pyramid, triangle prism, pentagonal prism, hexagonal prism, or the like.

As illustrated in FIG. 1A, the optical element 120 may be filmed or coated with the transparent, conductive layer 130 that functions as an interlock for laser safety. Specifically, the transparent, conductive layer 130 can be shaped as a trace that is electrically in series with the semiconductor laser 110. When the optical element 120 (or lens) is damaged, fractured, or broken, the transparent, conductive layer 130 (i.e. trace) is electrically interrupted, which causes the semiconductor laser 110 to stop operating. This may prevent the semiconductor module 100 from becoming unsafe.

The transparent, conductive layer 130 may be made of any optically transparent, electrically conductive material. Examples of such transparent, conductive materials include, but are not limited to, indium tin oxide (ITO), aluminum-doped zinc oxide (AZO), gallium-doped zinc oxide (GZO), indium-doped zinc oxide (IZO), indium-doped cadmium oxide (CdO:In), carbon nanotube, graphene, inherently conductive polymers (ICPs), amorphous indium-zinc oxide, and silver nanop article-ITO hybrid.

Figure 1B:
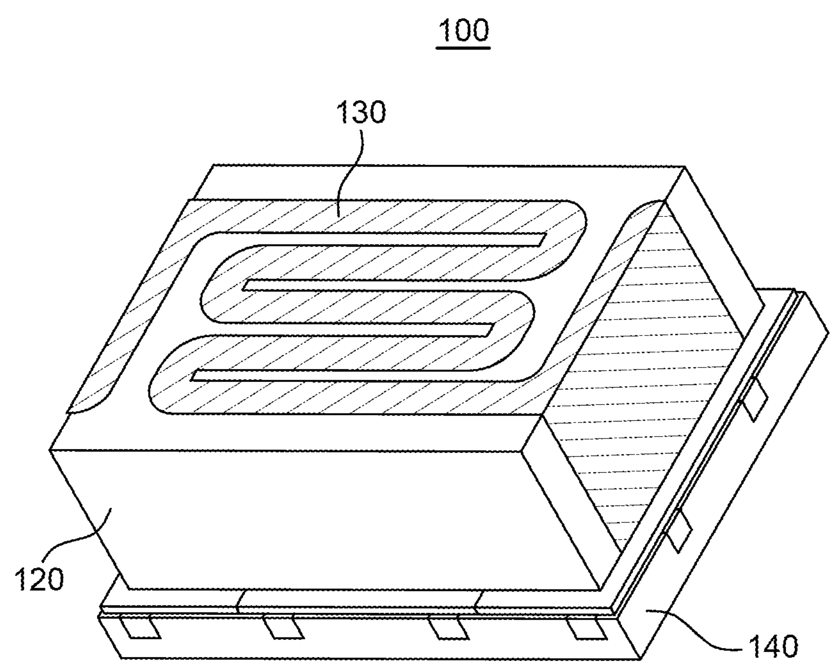
FIG. 1B is a three dimensional diagram of the example semiconductor laser module that is illustrated in FIG. 1A.

The semiconductor laser 110 and the transparent, conductive layer 130 (i.e. trace) are electrically in series with the printed circuit board (PCB) 140 where an electrical current is provided. The electrical current may circulate the semiconductor laser 110, the transparent conductive layer 130, and the PCB 140 while the semiconductor laser module 100 is normally operating (i.e. without damage on the trace). FIG. 1B is a three dimensional diagram of the semiconductor laser module 100 illustrated in FIG. 1A.

Figure 2A:
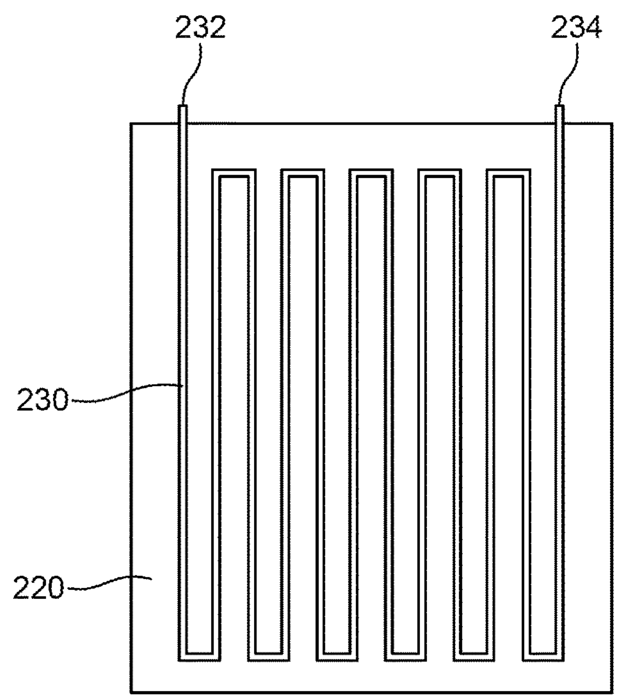
FIG. 2A is a diagram illustrating an example shape of trace that may be used within the semiconductor laser module illustrated in FIGS. 1A and 1B.
Figure 2B:
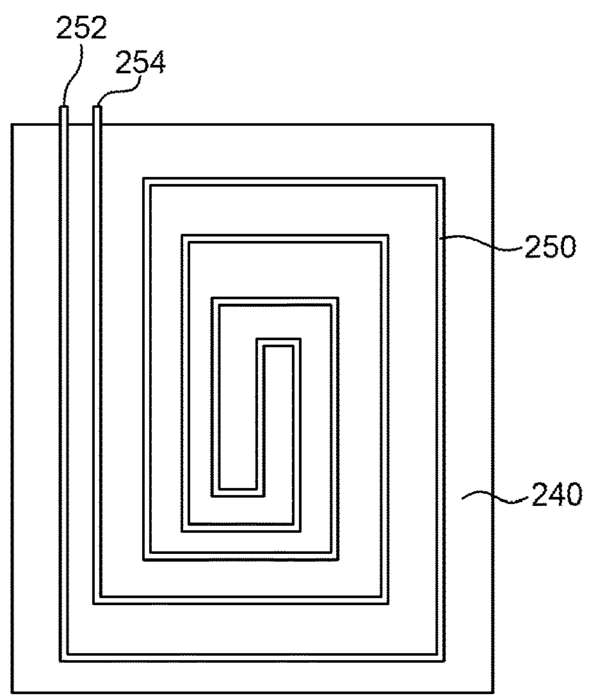
FIG. 2B is a diagram illustrating another example shape of trace that may be used within the semiconductor laser module illustrated in FIGS. 1A and 1B.

FIGS. 2A and 2B illustrate example shapes of traces 230, 250 on optical elements 220, 240, which may be used in combination with any of the embodiments described herein. As illustrated in FIG. 2A, the trace 230 can be a curved (or radiator) shape. As illustrated in FIG. 2B, the trace 240 can be a spiral shape. The traces 230, 250 may have any type of shape. Example shapes of traces 230, 250 include, but are not limited to, a curbed shape, coiled shape, stripe shape, box shape, circular shape, spiral shape, and triangular shape. The traces 230, 250 may partially or fully cover the surface of the optical element 220, 240. However, the traces 230, 250 may need to be densely placed on the surface of the optical element 220, 240 to the extent that they can detect any damage on the optical element 220, 240 if an event occurs. For example, if the optical element 220, 240 are cracked or broken, the electrical current on the trace 230, 250 is disconnected. Since the semiconductor laser is electrically connected to the PCB and the trace 230, 250, the semiconductor laser may be switched off when the trace 230, 250 on the optical element 220, 240 is damaged. End points 232, 234, 252, 254 of the traces 230, 250 may be connected to the PCB. The electrical current may flow into the endpoints 232, 252 and flow out through the endpoints 234, 254, or vice versa.

Figure 3A:
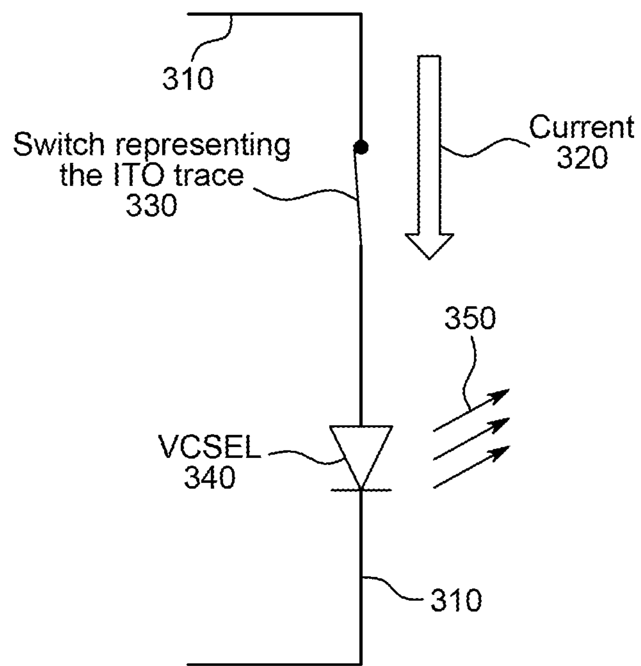
FIG. 3A is a diagram illustrating an example connection where an electrical current flows through a vertical-cavity surface-emitting laser (VCSEL) when an ITO trace is not damaged.

FIG. 3A illustrates an example connection where an electrical current 320 flows through a vertical-cavity surface-emitting laser (VCSEL) 340 when the ITO trace 310 is not damaged. Although the trace 310 may not include a switch on it, the operation of the VCSEL 340 may be illustrated by a switch representing the ITO trace 330 as an example. For example, when there is no damage on the ITO trace 310, the current 320 flows through the VCSEL 340 as if the switch controlling the VCSEL (i.e. the switch representing the ITO trace 330) is connected or closed. When the switch representing the ITO trace 330 is connected or closed (i.e. there is no damage on the ITO trace 310), the current 320 flows into the VCSEL 340 and thereby the VCSEL 340 can emit laser light 350. It should be noted that the VCSEL 340 may be replaced with any type of semiconductor laser such as Laser diode (LD), Double heterostructure laser (DH), Separate confinement heterostructure laser (SCH), Distributed Bragg reflector laser (DBR), Distributed feedback laser (DFB), Quantum well laser, Quantum dot laser, Quantum cascade laser (QCL), External-cavity laser (ECL), Extended cavity diode laser, Volume Bragg grating laser, Vertical-external-cavity surface-emitting-laser (VECSEL), Hybrid silicon laser, Interband cascade laser (ICL), Semiconductor ring laser, or the like.

Figure 3B:
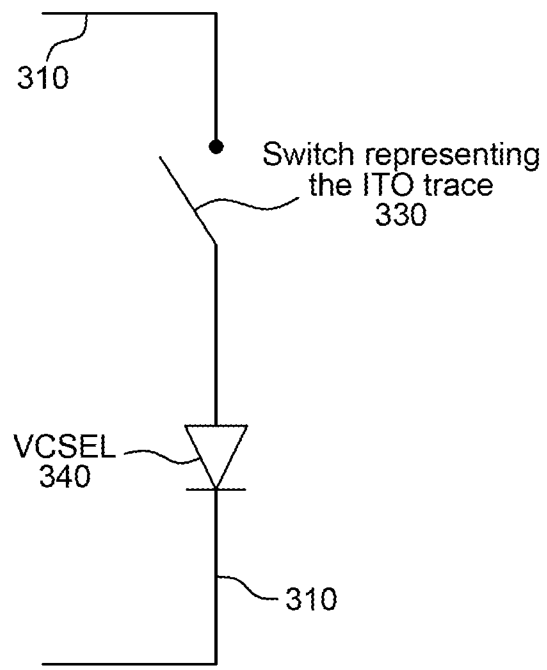
FIG. 3B is a diagram illustrating an example connection where an electrical current is interrupted when an ITO trace is damaged.

FIG. 3B illustrates an example connection where an electrical current 320 is interrupted when an ITO trace 310 is damaged. Similar to FIG. 3A, although the trace 310 may not include a switch on it, the operation of the VCSEL 340 may be illustrated by a switch representing the ITO trace 330 as an example. For example, when the ITO trace 310 is damaged, fractured, or broken, the current 320 may not flow through the VCSEL 340 as if the switch controlling the VCSEL (i.e. the switch representing the ITO trace 330) is disconnected or open. When the switch representing the ITO trace 330 is disconnected or open (i.e. there is damage on the ITO trace 310), the VCSEL 340 shuts down the laser light 350, thereby preventing unsafe situation.

Figure 4A:
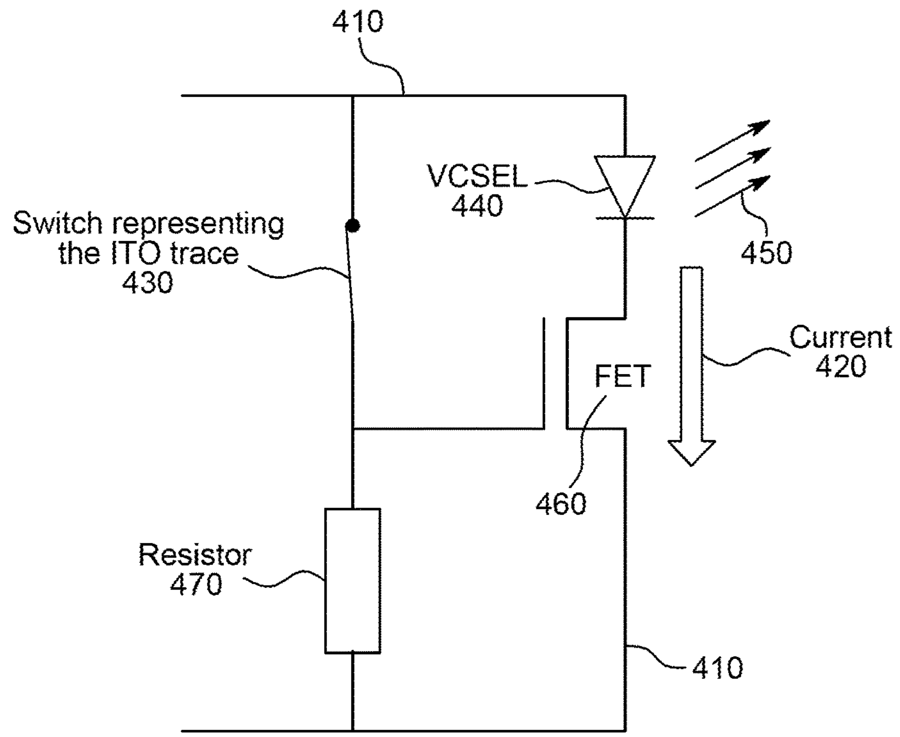
FIG. 4A is a diagram illustrating an example connection where an electrical current flows through a VCSEL when an ITO trace in gate to a field effect transistor (FET) is not damaged.

FIG. 4A illustrates an example connection where an electrical current 420 flows through a VCSEL 440 when an ITO trace 410 in gate to a field effect transistor (FET) 460 is not damaged. Although the trace 410 may not include a switch on it, the operation of the VCSEL 440 may be illustrated by a switch representing the ITO trace 430 as an example. For example, when there is no damage on the ITO trace 410, the current 420 flows into the VCSEL 440 and the FET as if the switch controlling the VCSEL (i.e. the switch representing the ITO trace 430) is connected or closed.

In case where the ITO trace 410 may not conduct the electrical current 420 well, the FET 460 and the register 470 may be used to amplify the electrical current 420. The FET 460 may be located anywhere in the VCSEL module such as a PCB. However, it needs to be connected to the trace 410 to make sure that the electrical current 420 flows through the VCSEL 440. Although it is not illustrated in FIG. 4A, any type of transistor or switch may be used for the FET 460.

Similar to FIG. 3A, when the switch representing the ITO trace 430 is connected (i.e. there is no damage on the ITO trace 410), the current 420 flows into the VCSEL 440 and the FET 460, and thereby the VCSEL 440 emits laser light 450. It should be noted that the VCSEL 440 may be replaced with any type of semiconductor laser such as Laser diode (LD), Double heterostructure laser (DH), Separate confinement heterostructure laser (SCH), Distributed Bragg reflector laser (DBR), Distributed feedback laser (DFB), Quantum well laser, Quantum dot laser, Quantum cascade laser (QCL), External-cavity laser (ECL), Extended cavity diode laser, Volume Bragg grating laser, Vertical-external-cavity surface-emitting-laser (VECSEL), Hybrid silicon laser, Interband cascade laser (ICL), Semiconductor ring laser, or the like.

Figure 4B:
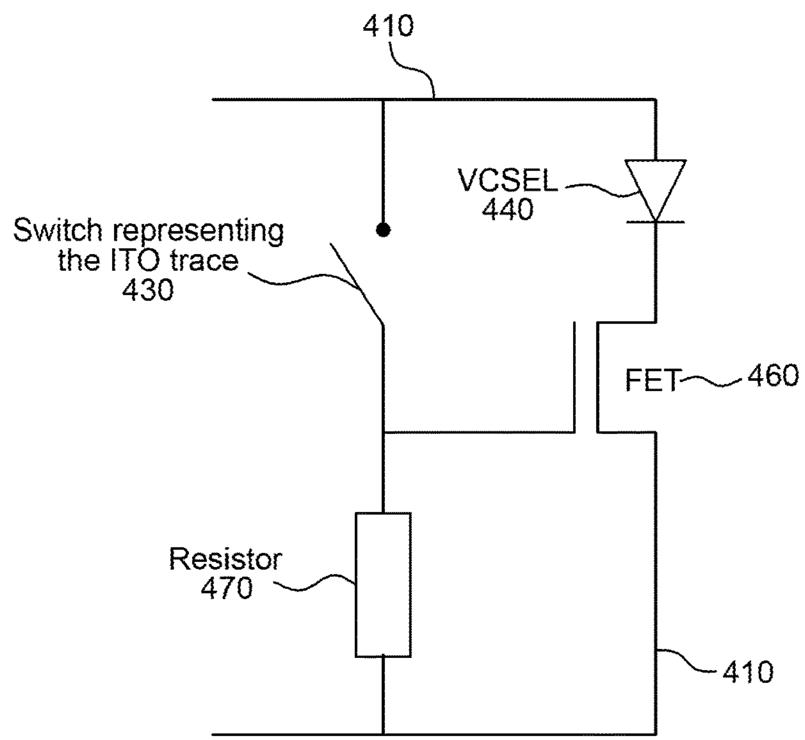
FIG. 4B is a diagram illustrating an example connection where an electrical current is interrupted when an ITO trace in gate to a FET is damaged.

FIG. 4B illustrates an example connection where an electrical current 420 is interrupted when an ITO trace 410 in gate to a FET 460 is damaged. Similar to FIG. 4A, although the trace 410 may not include a switch on it, the operation of the VCSEL 440 may be illustrated by a switch representing the ITO trace 430 as an example. For example, when the ITO trace 410 is damaged, fractured, or broken, the current 420 may not flow through the VCSEL 440 and the FET 460 as if the switch controlling the VCSEL 440 (i.e. the switch representing the ITO trace 430) is disconnected or open. When the switch representing the ITO trace 430 is disconnected or open (i.e. there is damage on the ITO trace 410), the VCSEL 440 shuts down the laser light 450, thereby preventing unsafe situation.

Figure 5:
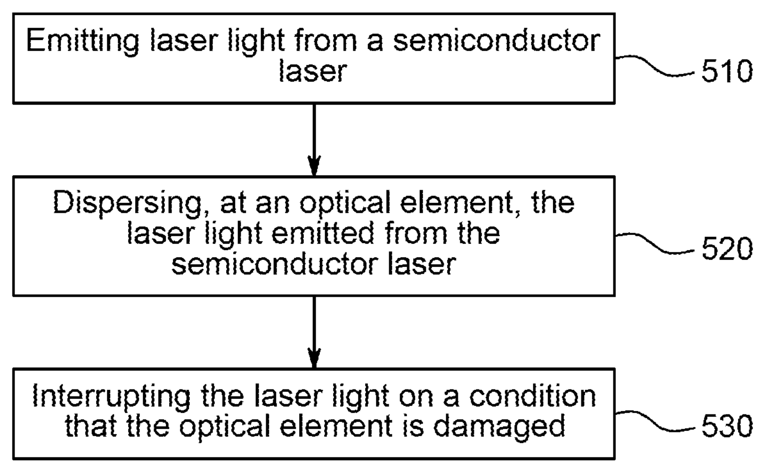
FIG. 5 is a diagram illustrating an example process for providing laser safety with an optical element that is coated with a transparent, conductive material.

FIG. 5 illustrates an example process for providing laser safety with an optical element that is filmed or coated with a transparent, conductive material that serves (or services) as an interlock on a semiconductor laser module. This example process may be used in combination with any of the embodiments described herein. For example, at step 510, a semiconductor laser in a semiconductor laser module emits laser light through an optical element or lens. The optical element coupled with the semiconductor laser may disperse or diffuse the laser light emitted from the semiconductor laser. The optical element may be filmed or coated with a transparent conductive material that serves as an interlock on the semiconductor laser. Examples of the transparent, conductive material includes indium tin oxide (ITO), aluminum-doped zinc oxide (AZO), gallium-doped zinc oxide (GZO), indium-doped zinc oxide (IZO), indium-doped cadmium oxide (CdO:In), carbon nanotube, graphene, inherently conductive polymers (ICPs), amorphous indium-zinc oxide, silver nanoparticle-ITO hybrid, or any combination thereof.

The transparent, conductive material may be placed in any shape that can detect damage on the optical element. For example, it can be the shape of a trace. Example of the shapes of the transparent, conductive material include a curbed shape, radiator shape, spiral shape, circular shape, polygon shape, triangular shape, square shape, rectangular shape, trapezoidal shape, or the like. The trace may be electrically in series with the semiconductor laser to flow the current from a PCB to the semiconductor laser. On a condition that the trace is damaged, fractured, or broken, the trace is electrically interrupted, which causes the semiconductor laser to stop operating or shut down at step 530.

The embodiments described herein may be incorporated into any suitable transparent conducting film or coating on a lens that that serves as an interlock on a semiconductor laser module. Embodiments of the invention are not limited to the particular structures illustrated. It should be noted that the shape of trace on an optical element described above are simply one example or case of numerous other possibilities.

The non-limiting methods described herein for a method and apparatus for a transparent conducting film or coating on a lens that that serves as an interlock on a semiconductor laser module may be modified for a variety of applications and uses while remaining within the spirit and scope of the claims. The implementations and variations described herein, and/or shown in the drawings, are presented by way of example only and are not limiting as to the scope and spirit. The descriptions herein may be applicable to all implementations of the method and apparatus for a transparent conducting film or coating on a lens that that serves as an interlock on a semiconductor laser module although it may be described with respect to a particular implementation.

As described herein, the methods described herein are not limited to any particular element(s) that perform(s) any particular function(s) and some steps of the methods presented need not necessarily occur in the order shown. For example, in some cases two or more method steps may occur in a different order or simultaneously. In addition, some steps of the described methods may be optional (even if not explicitly stated to be optional) and, therefore, may be omitted. These and other variations of the methods disclosed herein will be readily apparent, especially in view of the description of a method and apparatus described herein, and are considered to be within the full scope of the invention.

Some features of some implementations may be omitted or implemented with other implementations. The device elements and method elements described herein may be interchangeable and used in or omitted from any of the examples or implementations described herein.

Although features and elements are described above in particular combinations, each feature or element can be used alone without the other features and elements or in various combinations with or without other features and elements.

What is claimed is:

1. A semiconductor laser module comprising:

a semiconductor laser; and an optical element operatively coupled with the semiconductor laser to disperse laser light emitted from the semiconductor laser, wherein the optical element is coated with a transparent conductive material that serves as an interlock on the semiconductor laser in the form of a trace that covers a substantial portion of a surface of the optical element opposite the semiconductor laser.

2. The semiconductor laser module of the claim 1, wherein the transparent conductive material includes at least one of an indium tin oxide (ITO), aluminum-doped zinc oxide (AZO), gallium-doped zinc oxide (GZO), or indium-doped zinc oxide (IZO).

3. The semiconductor laser module of the claim 1, wherein the trace is electrically in series with the semiconductor laser.

4. The semiconductor laser module of the claim 1, wherein the laser light emitted from the semiconductor laser is interrupted on a condition that the trace is damaged.

5. A method comprising:

emitting laser light from a semiconductor laser;

dispersing, at an optical element that is operatively coupled with the semiconductor laser, the laser light emitted from the semiconductor laser; and interrupting the laser light on a condition that the optical element is damaged, wherein the optical element is coated with a transparent conductive material in the form of a trace that covers a substantial portion of a surface of the optical element opposite the semiconductor laser that serves as an interlock on the semiconductor laser.

6. The method of the claim 5, wherein the transparent conductive material includes at least one of an indium tin oxide (ITO), aluminum-doped zinc oxide (AZO), gallium-doped zinc oxide (GZO), or indium-doped zinc oxide (IZO).

7. The method of the claim 5, wherein the trace is electrically in series with the semiconductor laser.

8. The method of the claim 5, wherein the laser light emitted from the semiconductor laser is interrupted on a condition that the trace is damaged.

9. The semiconductor laser module of the claim 1, wherein the transparent conductive material covers a majority of at least one sidewall of the optical element adjacent to the surface of the optical element opposite the semiconductor laser.

10. The semiconductor laser module of the claim 9, wherein:

connections to the trace extend to opposite sidewalls, and the transparent conductive material covers a majority of opposing sidewalls of the optical element adjacent to the surface of the optical element opposite the semiconductor laser.

11. The semiconductor laser module of the claim 1, wherein the trace is formed in a radiator shape that extends across almost all of the surface of the optical element opposite the semiconductor laser.

12. The semiconductor laser module of the claim 11, wherein connections to the trace are on opposite sides of a same sidewall of the optical element adjacent to the surface of the optical element opposite the semiconductor laser.

13. The semiconductor laser module of the claim 1, wherein the trace is formed in a spiral shape that extends across almost all of the surface of the optical element opposite the semiconductor laser.

14. The semiconductor laser module of the claim 13, wherein connections to the trace are proximate to each other on a same side of a same sidewall of the optical element adjacent to the surface of the optical element opposite the semiconductor laser.

15. The semiconductor laser module of the claim 1, wherein the trace fully covers the surface of the optical element opposite the semiconductor laser.

16. The semiconductor laser module of the claim 1, wherein the trace provides a current directly to an anode or cathode of the semiconductor laser.

17. The semiconductor laser module of the claim 1, wherein the trace provides a current to a gate of a transistor connected in series with the semiconductor laser, the transistor used to control current through the semiconductor laser.

* * * * *